United States Patent [19]

Levy

[11] Patent Number: 5,534,787

[45] Date of Patent: Jul. 9, 1996

[54] HIGH-FREQUENCY COAXIAL INTERFACE TEST FIXTURE

[75] Inventor: Paul S. Levy, Chandler, Ariz.

[73] Assignee: VLSI Technology, Inc., San Jose, Calif.

[21] Appl. No.: 353,463

[22] Filed: Dec. 9, 1994

[51] Int. Cl.⁶ .................................................. G01R 31/02
[52] U.S. Cl. ........................................... 324/761; 324/754
[58] Field of Search .................................. 324/757, 758, 324/761, 754

[56] References Cited

U.S. PATENT DOCUMENTS

| | | | |
|---|---|---|---|
| 4,496,903 | 1/1985 | Paulinski | 324/761 |
| 4,574,236 | 3/1986 | Hechtman | 324/761 |
| 5,136,238 | 8/1992 | Kade | 324/761 |

*Primary Examiner*—Ernest F. Karlsen
*Assistant Examiner*—Russell M. Kobert
*Attorney, Agent, or Firm*—LaValle D. Ptak

[57] ABSTRACT

A test fixture for use in the testing of integrated circuit devices includes a metal conductive base plate mounted on a printed circuit wiring board. The base plate has holes extending through it between its upper and lower surfaces. An electrically conductive metal floating plate is resiliently biased upward to a normal position spaced a short distance above the upper surface of the base plate. The floating plate has holes through it which mate with and correspond to the holes through the base plate. Insulating sleeves, with spring pin connectors inside, are placed in the holes in the base plate and these sleeves extend upwardly above the surface of the base plate to a height not greater than the sum of the thickness of the base plate and of the thickness of the floating plate. When the floating plate is lowered into physical contact with the base plate, the spring pin connectors extend above the upper surface of the floating plate and complete electrical connections with a circuit board placed on the floating plate. The combined base plate and floating plate assembly become part of an electrical shield of a coaxial connection, in which the spring pin connectors are the inner conductors.

25 Claims, 1 Drawing Sheet

HIGH-FREQUENCY COAXIAL INTERFACE TEST FIXTURE

BACKGROUND

Test fixtures are commonly employed for the electrical testing of printed circuit boards and integrated circuit chips. In the case of printed circuit boards, the completed printed circuit board is placed on the test fixture; and electrical connections are made to selected contact points on the printed circuit board for effecting the electrical tests. In the case of integrated circuits, the integrated circuit typically is mounted on a printed circuit wiring board, which then is used in the test fixture to complete electrical circuit interconnections through the wiring board to the test fixture.

In both printed circuit board test fixtures and integrated circuit test fixtures of the type where the integrated circuit chip is placed on a board, it is very important that accurate registration is effected between probes in the test fixture and corresponding circuit connection points on the test boards. The registration between the probes and the contact points on the test boards necessarily must be capable of repetition over a large number of cycles of operation of the test apparatus.

Typically, the probes in the test apparatus constitute telescoping spring biased probe connectors, which exert a predetermined force against the contact points or positions on the underside of the printed circuit board which is undergoing test, or which is used to operate as an interface to an integrated circuit undergoing test. To initiate a test, the circuit board is pressed downwardly onto the test fixture to depress the probes which make contacts with appropriate electrical contact points on the underside of the circuit board. When the circuit board is removed, the probes extend to their maximum extension length, which necessarily is above the upper planar surface of the test fixture itself. If the probes are left in this exposed position, it is possible for the probes to become damaged accidentally, or, if a test fixture is not properly aligned with the probes, to cause bending or damage of the probes as the circuit board under test is depressed or moved downwardly onto the test fixture.

To overcome the potential for damaging the relatively small and delicate spring loaded probes, test fixtures have been developed in which a movable plate, having aligned holes or apertures in it, is mounted for reciprocal movement above the top of the portion of the test fixture to which the probes are attached. When the movable plate is biased upwardly out of engagement with the surface of the test fixture, or is biased to its uppermost position, the tips of the probes either are withdrawn completely from the movable plate or extend part way into holes in the movable plate. The probes, however, do not extend above the upper surface of the movable plate. When such devices are used, the integrated circuit board for the device under test then is placed and located on top of the movable plate. Once the circuit board is in place, the movable or floating plate is lowered. This causes the probes or pins to extend through the holes in the movable plate to make electrical contact with the circuit board, which is carried on the movable or floating plate. In many devices of this type, a vacuum is used to draw the floating plate and the circuit board downwardly until various ones of the spring pin probes make contact through the apertures in the floating plate with the board under test. In some cases, the movement of the board and floating plate downwardly is effected manually, without a vacuum, by means of cams or other mechanical apparatus. The electrical operation of the devices, however, are the same in either case.

The Murray U.S. Pat. No. 4,544,886; Fowler U.S. Pat. No. 4,573,009; Angelucci U.S. Pat. No. 4,841,231; Seavey U.S. Pat. No. 5,247,249; Metrone U.S. Pat. No. 4,321,533; and Nesbitt U.S. Pat. No. 4,746,861 are directed to the overall technique described above, employing a floating plate for effecting accurate registration between test probes or spring pin connectors. All of these patents employ the underlying idea of a base plate with spring probes or spring pin connectors soldered or otherwise attached to the base plate. A spring biased floating plate is placed above the base plate. This floating plate has apertures through it, which permit the probes or spring pin connectors to extend through the apertures. In the absence of any loading, the tips of the pins either are below these apertures or are located within them.

The Janko U.S. Pat. No. 5,015,946 somewhat reverses the process of the patents noted above, and operates to lower the spring loaded probes onto the device under test. The overall operation of the device of Janko, however, is similar to that of the other patents where the printed circuit board and floating plate are drawn downwardly by the vacuum supply or other mechanical apparatus.

In all of the patents noted above, the base plate and the floating or movable plate are made of insulating material to avoid any electrical shorts between these plates and the connector probes and the circuit board connectors placed on top of the floating plate. Thus, if high frequency signals are passed through the probes or spring pin connectors, interference between at least adjacent probes may take place, resulting in erroneous test results.

It is desirable to provide a simple, spring-loaded, high frequency interface system for a test fixture, which provides the protection of the prior art devices noted above for the probes or spring pin connectors, and which further provides electrical shielding for the probes.

SUMMARY OF THE INVENTION

It is an object of this invention to provide an improved electrical test fixture.

It is another object of this invention to provide an improved high-frequency interface system for a test fixture.

It is an additional object of this invention to provide an improved high-frequency electrical interface which provides spring probe protection.

It is a further object of this invention to provide a test fixture for use in the testing of an integrated circuit device where an electrically conductive base plate has spring pin connectors installed in it in insulating sleeves.

In a preferred embodiment of the invention, a test fixture for use in the testing of integrated circuit devices includes an electrically conductive base plate. This base plate has a first predetermined thickness between upper and lower surfaces located in spaced parallel planes. A plurality of holes are formed through the base plate, and extend through the upper and lower surfaces. Insulating sleeves are placed in each hole in the base plate, and extend above the upper surface of the base plate. An electrically conductive floating plate having a second predetermined thickness is normally biased to a position spaced a short distance above the upper surface of the base plate. This floating plate has holes through it in alignment with corresponding holes through the base plate. Spring pin connectors are mounted in each of the sleeves on the base plate; and these connectors have an extended length above the upper surface of the base plate which is greater than the thickness of the floating plate, but is less than the thickness of the floating plate and the distance the floating plate normally is biased above the upper surface of the base plate. Thus, when the floating plate is depressed to its lowermost position, the spring pin connectors extend above the upper surface of the floating plate.

DETAILED DESCRIPTION

Figure 1:
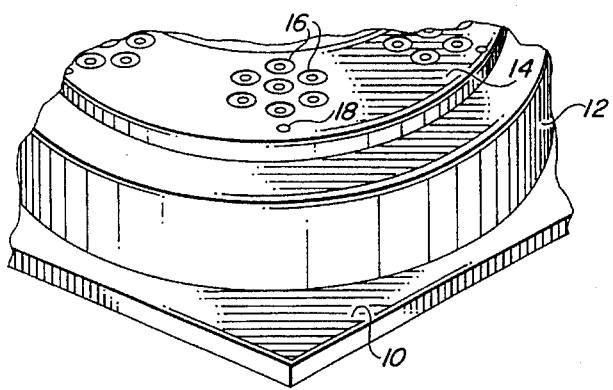
FIG. 1 is a partial top perspective view of a preferred embodiment of the invention.
Figure 2:
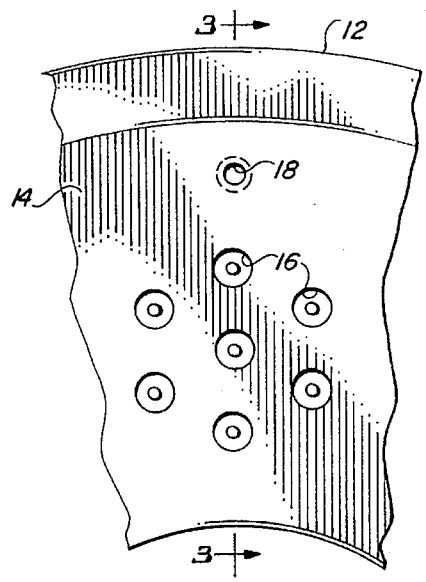
FIG. 2 is a top view of a portion of the embodiment shown in FIG. 1.

Reference now should be made to the drawing, in which the same reference numbers are used throughout the different figures to designate the same components.

FIG. 1 is a partially cut away top perspective view of a preferred embodiment of the invention. As illustrated in FIG. 1, the invention is used with an integrated circuit tester or test system, which employs a printed circuit board 10 as an interface between the operating electronics of the tester (not shown) and an integrated circuit device (not shown) which is to undergo test. The circuit board 10 has a wiring pattern typically printed on its lower surface, and supports a ring-shaped metal base plate 12 on its upper surface. The base plate 12 is attached to the board 10 in any suitable fashion; and the entire assembly then is connected to a tester to test integrated circuit chips. To effect circuit interconnections between a printed wiring circuit test board 50 (FIG. 4) on which the integrated circuit device under test is placed, the base plate ring 12 has a large number of cylindrical holes 40 formed through it between the upper and lower parallel planar surfaces of the base plate 12. These holes 40 are shown most clearly in FIGS. 3, 4 and 5. A hollow cylindrical insulating sleeve 42, preferably made of teflon or other insulating material, is placed within each of the holes 40 through the metal base plate 12, as shown most clearly in FIGS. 3, 4 and 5. Within each of the sleeves 42, a spring pin connector body 44 is mounted, with a lower connector 46 extended through the printed circuit board 10 and soldered to or otherwise electrically connected with a wiring pattern on the underside of the board 10. This is illustrated most clearly in FIG. 5, which indicates a cross section 47 of a wiring pattern to which the pin 46 is soldered for one of the spring pin connectors 44. The connectors 44/48 are of a conventional type used in printed circuit board and integrated circuit board test fixtures. Typically, the connectors are in the form of a telescoping assembly having a main body portion 44 and an extension pin 48, which normally is spring biased outwardly to a maximum position. The pin 48 may be pressed downwardly into the body 44 when pressure is applied to the end of the spring pin 48.

As mentioned previously, damage may occur to the spring pin connectors 44/48 if they are struck laterally, or if a body is moved across the tips 48 of the spring pin connectors in a lateral direction. This may cause bending or breaking of the relatively fragile spring pins 48 thereby creating the necessity of replacement of a spring pin connector 44/48 whenever such damage occurs.

Figure 3:
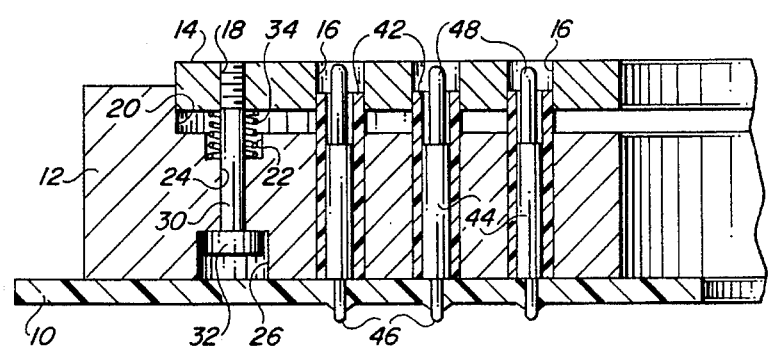
FIG. 3 is a cross-sectional view taken along the line 3—3 of FIG. 2 showing the embodiment in one position of operation.
Figure 4:
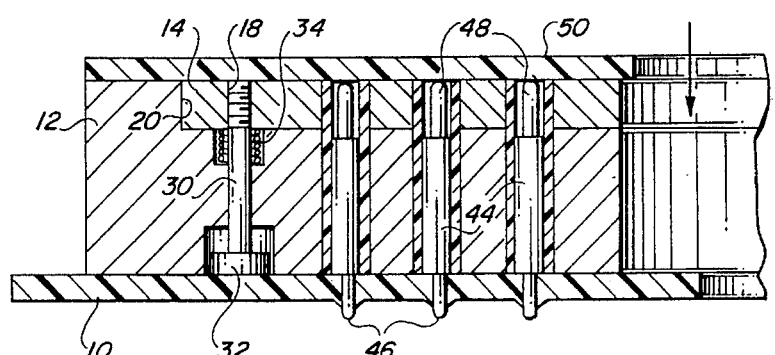
FIG. 4 is a cross-sectional view of the same embodiment shown in FIG. 3 in a second position of operation.

To prevent damage to the spring pin connectors 44/48, a floating metal plate in the form of a ring 14 is resiliently attached to the base plate 12 and is maintained in alignment with the base plate 12 by means of a spring and shoulder bolt assembly shown in FIGS. 3 and 4. As illustrated, a plurality of shoulder bolts 30/32 each extend through a cylindrical hole or sleeve 24 in the base plate 12 and are threaded into a mating threaded hole 18 in the floating plate 14. Only one of the shoulder bolt assemblies is shown in FIGS. 3 and 4; but it should be understood that several (typically, three or four) are angularly spaced from one another to provide uniform support for the floating plate 14 over the base plate 10.

As illustrated in FIGS. 3 and 4, the base plate 12 also has a recess in it formed by an upstanding shoulder 20 around the outer circumference of the base plate 12. This causes an inner recess to be located in the upper surface of the base plate 12, as shown in FIGS. 3 and 4. The shoulder bolt shaft 30 has a compression coil spring 34 mounted around it. The spring 34 is seated in an enlarged cylindrical recess 22, as shown in FIGS. 3 and 4. The lower end of the shoulder bolt 30 is attached to an enlarged head 32, which is mounted for vertical reciprocal movement in an enlarged cylindrical recess 26 extending outwardly to the bottom or lower surface of the base plate 12. In assembling the device, the shoulder bolts 30/32 first are inserted into the holes 24 in the base plate 12. The springs 34 are placed over the opposite ends of the bolts to rest in the recesses 22, and the bolts then are threaded into engagement with the floating plate 14. The bolts are adjusted to cause the upper and lower parallel planar surfaces of the floating plate 14 to be parallel to the upper surface in the recess of the base plate 12. Once the assembly has been completed, the base plate is attached to the printed circuit board 10. This captivates the enlarged head 32 of the shoulder bolt in the cavity 26 between the printed circuit board 10 and the narrow hole 24, which accommodates the shank or shaft 30 of the shoulder bolt 30/32.

When the device is not in use, the springs 34 push the floating plate 14 upwardly to the position shown in FIG. 3. It should be noted that the thickness of the floating plate 14 between its upper and lower surfaces is selected to be equal to the height of the shoulder 20 above the plane of the recess in the top of the base plate 12, as illustrated most clearly in FIG. 4. In the normal unused position, however, the plate 14 is biased upwardly as shown in FIG. 3. From an examination of FIG. 3, it can be seen that the insulating sleeves 42 have a length which is equal to the thickness of the base plate at the recess, plus the thickness of the floating plate 14. When the relative dimensions which are illustrated in FIG. 3 are used, the sleeves 42 extend into the aligned mating holes 16 in the floating plate 14 and further assist in maintaining alignment of the floating plate 14 with the holes in the base plate 12.

Figure 5:
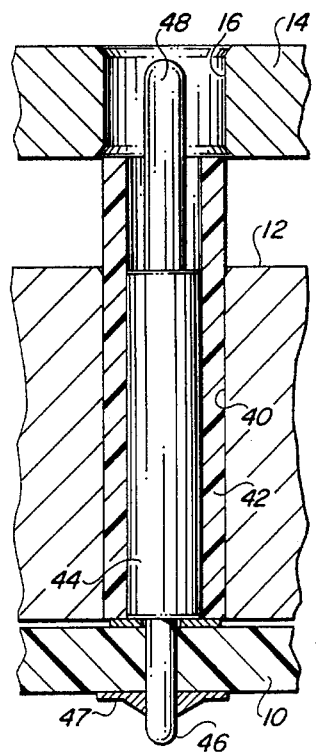
FIG. 5 is an enlarged detail of a portion of the embodiment shown in FIG. 3.

Also, as illustrated in FIGS. 3 and 5, the fully extended positions of the pins 48 when the floating plate 14 is biased to its uppermost position are such that the ends of the pins 48 are located at a point beneath the plane of the upper surface of the floating plate 14. This prevents accidental damage from occurring to the pin extensions 48 of the spring pin connectors 44/48, since any object which is laterally moved across the upper surface of the floating plate 14 when it is in this uppermost position, passes over the top of the holes 16 without engaging the tips of the pin extensions 48 of the spring pin connectors 44/48.

When an integrated circuit device is to be tested, it is mounted in a conventional manner on a printed circuit wiring board 50, which is made of insulating material. The board 50, for use with the particular test fixture illustrated, has wire-through connectors extending to its lower surface in alignment with holes 16 in the plate 14 for engagement by the conductive tips 48 of the spring pin connectors 44/48 for the particular board 50 associated with the device under test. These connectors on the board 50 have not been shown in FIG. 4 since they are conventional and are not necessary for an understanding of the operation of the invention. In addition, alignment apparatus, common for test fixtures of the type illustrated, is used to properly align the test board 50 with the pin positions in the holes 16 through the plate 14, as required. This alignment apparatus is conventional; and, therefore, it is not shown in FIGS. 1 through 5.

It should be noted, however, that once the printed circuit board 50 for the device under test is placed in position, it then is pressed downwardly onto the upper surface of the floating plate 14 to press the floating plate 14 downwardly against the bias of the springs 34, as indicated in FIG. 4. This completes an electrical shield comprising the base plate 12 and the floating plate 14, which surrounds each of the insulating sleeves 42. The sleeves 42, in turn, each contain an inner conductor of a conductive coax (the outer shield conductor of which constitutes the plates 12 and 14) in the form of the spring pin connectors 44/48.

When the plate 14 is pressed downwardly to the position shown in FIG. 4, the extensions 48 of the spring pin connectors 44/48 normally would extend above the upper surface of the floating plate 14. Since the test board 50, however, covers the openings 16, the spring pins 48 simply press against the under surface of the test board 50. For those pins located in a position where an electrical contact pad also is located on the under surface of the board 50, an electrical connection is made for interfacing between the corresponding lower pin 46 and the connection through the board 50 to the device under test. This connection is utilized for effecting a particular test operation for a given integrated circuit device under test.

It should be noted that the recess which is formed by the shoulder 20 may not be necessary in all cases; but, as is readily apparent from an examination of FIGS. 1, 3 and 4, this recess assists substantially in aligning the floating plate 14 with the holes 40 in the base plate 12, and substantially stabilizes the floating plate 14 against lateral movement in any direction by virtue of the overlap of the lower portion of the edge of the floating plate 14 with the vertical edge 20 of the shoulder surrounding the recess in the base plate 12.

By manufacturing the base plate 12 and the floating plate 14 of conductive material, preferably of a metal such as aluminum, the base plate and floating plate together form an electrical shield of coax connections including the various spring pin connectors 44/48. It also should be noted that the shoulder bolt 30/32 serves as a vertical stop, as well as a rotational stop, for the floating plate 14. Consequently, alignment of the floating plate 14 with the base plate 12 is effectively maintained by means of the recess and the shoulder bolts, and electrical interference shielding is effectively provided by the metal plates 12 and 14. Thus, the plates 12 and 14 serve a dual purpose of protecting the spring pin connectors 44/48 from damage and, at the same time, providing high frequency electrical shielding during operation of the device in a test fixture.

The foregoing description of the preferred embodiment of the invention is to be considered as illustrative and not as limiting. Various changes and modifications will occur to those skilled in the art for performing substantially the same function, in substantially the same way, to achieve substantially the same result, without departing from the true scope of the invention as defined in the appended claims.

What is claimed is:

1. A test fixture for use in the testing of integrated circuit devices, including in combination:

an electrically conductive base plate of a first predetermined thickness having an upper surface and a lower surface in spaced parallel planes;

a plurality of holes through said base plate extending therethrough between said upper surface and said lower surface;

an electrically conductive floating plate having a second predetermined thickness and having an upper surface and a lower surface in spaced parallel planes, said floating plate being resiliently mounted on said base plate and normally biased to a position spaced a predetermined distance above the upper surface of said base plate, said floating plate having a plurality of holes therethrough in alignment with corresponding holes in said base plate;

an insulating sleeve in each hole in said base plate, said sleeve having a length equal to the sum of said first and second predetermined thicknesses;

spring pin connectors mounted in each of said sleeves and having an extended length greater than the sum of said first and second predetermined thicknesses, but less than the sum of said first and second predetermined thicknesses and said predetermined distance, such that when said floating plate is depressed to engage the upper surface of said base plate, said spring pin connectors extend above the plane of the upper surface of said floating plate.

2. The combination according to claim 1 wherein said base plate and said floating plate are made of metal.

3. The combination according to claim 2 wherein said metal is aluminum.

4. The combination according to claim 2 wherein each of said spring pin connectors comprises the inner connector of a coaxial signal line and said base plate and said floating plate comprise an electrical shield of said coaxial signal line.

5. The combination according to claim 4 wherein said spring pin connectors comprise electrically conducting telescoping conductors normally, spring biased to said extended length thereof.

6. The combination according to claim 5 wherein the upper surface of said floating plate is adapted to underlie a circuit board carrying an integrated circuit device to be tested with said circuit board having electrical connections for selective connection by said spring pin connectors extended through said floating plate when said floating plate is depressed with the lower surface thereof in contact with the upper surface of said base plate.

7. The combination according to claim 6 further including a plurality of guide bolts and compression springs with said guide bolts attached to said floating plate and extending into guide channels in said base plate for controlling the movement of said floating plate toward and away from said base plate, wherein said springs are located between said base plate and said floating plate for resiliently biasing said floating plate said predetermined distance away from the upper surface of said base plate.

8. The combination according to claim 7 wherein said springs comprise coil springs surrounding said guide bolts.

9. The combination according to claim 8 wherein said holes through said base plate and said floating plate have a circular cross section in planes parallel to said upper and lower surfaces of said base plate and said floating plate.

10. The combination according to claim 9 wherein said insulating sleeves are in the form of elongated hollow cylinders, and said spring pin connectors are cylindrical spring pin connectors.

11. The combination according to claim 10 wherein said insulating sleeves are made of teflon.

12. The combination according to claim 11 further including a printed circuit load board, and wherein said base plate is mounted on said printed circuit load board and said spring pin connectors extend from the lower surface of said base plate to connections on said load board.

13. The combination according to claim 12 wherein said upper surface of said base plate is surrounded by an upwardly extending shoulder having a height equal to said second predetermined thickness.

14. The combination according to claim 13 wherein said predetermined distance is not greater than said second predetermined thickness.

15. The combination according to claim 1 wherein each of said spring pin connectors comprises the inner connector of a coaxial signal line and said base plate and said floating plate comprise an electrical shield of said coaxial signal line.

16. The combination according to claim 15 wherein said insulating sleeves are in the form of elongated hollow cylinders, and said spring pin connectors are cylindrical spring pin connectors.

17. The combination according to claim 16 wherein said insulating sleeves are made of teflon.

18. The combination according to claim 1 wherein said upper surface of said base plate is surrounded by an upwardly extending shoulder having a height equal to said second predetermined thickness.

19. The combination according to claim 18 wherein said base plate and said floating plate are made of metal.

20. The combination according to claim 1 wherein said spring pin connectors comprise electrically conducting telescoping conductors normally, spring biased to said extended length thereof.

21. The combination according to claim 1 further including a plurality of guide bolts and compression springs with said guide bolts attached to said floating plate and extending into guide channels in said base plate for controlling the movement of said floating plate toward and away from said base plate, wherein said springs are located between said base plate and said floating plate for resiliently biasing said floating plate said predetermined distance away from the upper surface of said base plate.

22. The combination according to claim 21 wherein said springs comprise coil springs surrounding said guide bolts.

23. The combination according to claim 22 wherein said predetermined distance is not greater than said second predetermined thickness.

24. The combination according to claim 1 wherein the upper surface of said floating plate is adapted to underlie a circuit board carrying an integrated circuit device to be tested with said circuit board having electrical connections for selective connection by said spring pin connectors extended through said floating plate when said floating plate is depressed with the lower surface thereof in contact with the upper surface of said base plate.

25. The combination according to claim 1 wherein said predetermined distance is not greater than said second predetermined thickness.

* * * * *